United States Patent
Kurumada et al.

(10) Patent No.: US 7,468,925 B2
(45) Date of Patent: Dec. 23, 2008

(54) SEMICONDUCTOR MEMORY DEVICE REALIZING HIGH-SPEED ACCESS

(75) Inventors: Marefusa Kurumada, Kyoto (JP); Katsuji Satomi, Osaka (JP)

(73) Assignee: Panasonic Corporation, Osaka (JP)

( * ) Notice: Subject to any disclaimer, the term of this patent is extended or adjusted under 35 U.S.C. 154(b) by 154 days.

(21) Appl. No.: 11/703,785

(22) Filed: Feb. 8, 2007

(65) Prior Publication Data

US 2008/0043554 A1  Feb. 21, 2008

(30) Foreign Application Priority Data

Feb. 13, 2006  (JP)  ............................. 2006-034618

(51) Int. Cl.
G11C 7/00 (2006.01)

(52) U.S. Cl. .................................. 365/203; 365/230.03
(58) Field of Classification Search ................. 365/203, 365/230.03, 63
See application file for complete search history.

(56) References Cited

U.S. PATENT DOCUMENTS

| | | | | |
|---|---|---|---|---|
| 5,926,432 A | * | 7/1999 | Kawai et al. | 365/230.03 |
| 6,580,629 B2 | * | 6/2003 | Ogata | 365/63 |
| 6,930,939 B2 | * | 8/2005 | Lim et al. | 365/203 |
| 7,286,439 B2 | * | 10/2007 | Fasoli et al. | 365/230.06 |
| 2005/0259501 A1 | | 11/2005 | Anvar et al. | 365/230.03 |
| 2006/0023555 A1 | | 2/2006 | Morishima | 365/230.03 |
| 2006/0098515 A1 | | 5/2006 | Mochida | 365/230.03 |
| 2006/0104119 A1 | | 5/2006 | Ha et al. | 365/185.25 |

FOREIGN PATENT DOCUMENTS

| | | |
|---|---|---|
| JP | 4-285794 | 10/1992 |
| JP | 11-238813 | 8/1999 |
| JP | 2005-25859 | 1/2005 |

* cited by examiner

*Primary Examiner*—Anh Phung
(74) *Attorney, Agent, or Firm*—Steptoe & Johnson LLP

(57) ABSTRACT

In data read, a single read global bit line is shared with a plurality of local bit lines.

12 Claims, 8 Drawing Sheets

F I G. 7
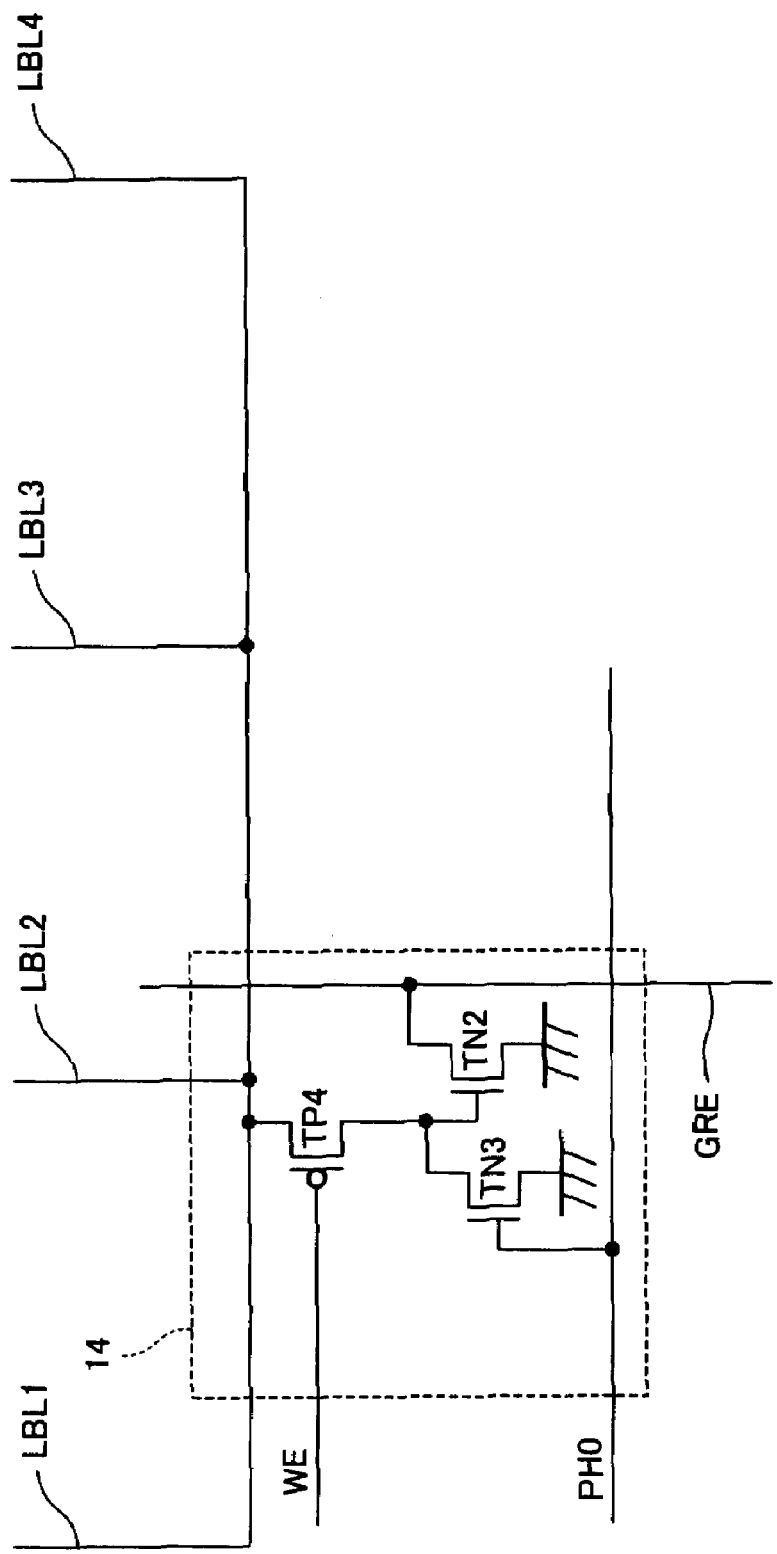

F I G. 8
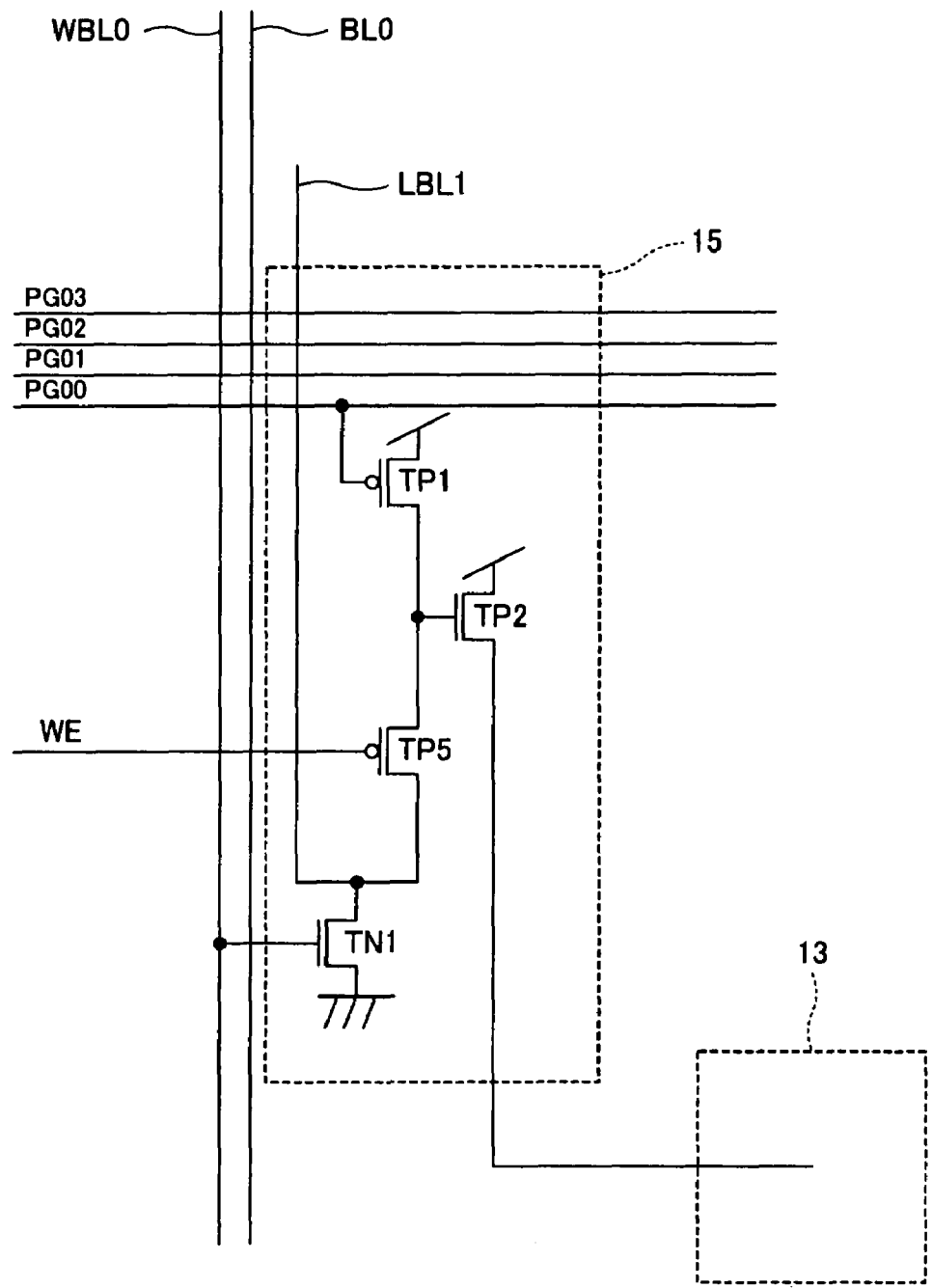

SEMICONDUCTOR MEMORY DEVICE REALIZING HIGH-SPEED ACCESS

BACKGROUND OF THE INVENTION (1) Field of the Invention

The present invention relates to a semiconductor memory device realizing high-speed access by division of a bit line.

(2) Description of the Related Art

By advancement of process generation, recently, there is increased a demand for high-speed data read from a memory. In conventional data read using a sense amplifier, it takes much time to draw an electrical charge from a bit line by a memory cell due to variations in transistor characteristics based on process subdivision, in particular, variations in current performance of the memory cell. Consequently, a time for access tends to be long.

In order to realize high-speed access in such a manner that a bit-line capacitance is decreased by division of a memory cell array, heretofore, various techniques are proposed. In a technique that data is read while being amplified by a hierarchical sense amplifier by division of a memory cell array, for example, an increase in circuit scale at a hierarchical part exerts a considerable influence on an area of a macro in a semiconductor chip.

In addition, there is proposed a technique that data is read by using a global read signal line at a hierarchical part (refer to, for example, JP2005-025859A and Japanese Patent No. 2744144).

Further, there is proposed a technique that data on a plurality of bit lines are outputted while being transferred to a single global bit line in advance (refer to, for example, Japanese Patent No. 3452497).

In a conventional semiconductor memory device, since a global bit line is provided for each bit line, a frequency of interconnections increases as bit lines increase in number. This hinders suppression of an increase in area in a case that a memory is mounted on a system LSI together with another component.

On the other hand, if data on a plurality of bit lines are outputted while being transferred to a single global bit line in advance by means of a switch in order to reduce a frequency of interconnections, a switching operation is additionally required. Consequently, although high-speed access is realized, variations in transistor characteristics based on process subdivision cannot be resolved.

In addition, a precharge operation must be performed for each bit line and global bit line. Consequently, power consumption becomes large if a global bit line is provided for each bit line.

SUMMARY OF THE INVENTION

The present invention is devised in order to solve the aforementioned conventional problems. An object of the present invention is to provide a semiconductor memory device capable of realizing high-speed access, preventing an increase in power consumption, reducing a frequency of interconnections, and suppressing an increase in chip area.

In order to accomplish this object, according to a first aspect of the present invention, a semiconductor memory device includes a plurality of integrated hierarchical arrays each having: a plurality of hierarchical arrays each including a plurality of memory cells connected to a first bit line and a second bit line and a read/write circuit connected to the first bit line, a write signal line and a hierarchical precharge control signal line; and an integrated circuit connected to the plurality of hierarchical arrays and a main read signal line. Herein, the plurality of second bit lines, the plurality of write signal lines and the main read signal line are shared with the plurality of integrated hierarchical arrays.

With this configuration, the semiconductor memory device according to the present invention has a functional effect of realizing high-speed access and a functional effect of reducing a frequency of interconnections.

According to a second aspect of the present invention, the read/write circuit includes: a hierarchical precharge control circuit having a hierarchical precharge transistor connected to the first bit line and the hierarchical precharge control signal line and controlling the hierarchical precharge transistor through the hierarchical precharge control signal line; and a second precharge circuit having a plurality of second precharge transistors connected to the plurality of second bit lines and the main read signal line, respectively.

With this configuration, the semiconductor memory device according to the present invention has a functional effect of realizing further high-speed access in hierarchical data read.

According to a third aspect of the present invention, the hierarchical precharge transistor is smaller in size than the second precharge transistor.

With this configuration, the semiconductor memory device according to the present invention has a functional effect of realizing high-speed access, a functional effect of reducing a frequency of interconnections, and a functional effect of reducing an area.

According to a fourth aspect of the present invention, the hierarchical precharge control circuit is connected to a column decode signal line, and is provided in a row decoder.

With this configuration, the semiconductor memory device according to the present invention has a functional effect of realizing high-speed access, a functional effect of reducing a frequency of interconnections, and a functional effect of suppressing an increase in area.

According to a fifth aspect of the present invention, the integrated circuit is configured by using a logic circuit.

With this configuration, the semiconductor memory device according to the present invention has a functional effect of realizing high-speed access without complicated control and a functional effect of reducing a frequency of interconnections.

According to a sixth aspect of the present invention, the integrated circuit includes an integrated precharge transistor precharging data outputted from the hierarchical array, and the hierarchical precharge control circuit includes an integrated precharge control circuit controlling the integrated precharge transistor through an integrated precharge control signal line.

With this configuration, the semiconductor memory device according to the present invention has a functional effect of realizing further high-speed access.

According to a seventh aspect of the present invention, the read/write circuit includes a P-channel transistor having a gate connected to the first bit line, an N-channel transistor having a gate connected to the write signal line, and a P-channel transistor having a gate connected to the hierarchical precharge control signal line from the hierarchical precharge control circuit.

With this configuration, the semiconductor memory device according to the present invention has a functional effect of realizing high-speed access, a functional effect of reducing a frequency of interconnections, and a functional effect of reducing an area.

According to an eighth aspect of the present invention, the integrated precharge control circuit stops the plurality of integrated precharge transistors concurrently.

With this configuration, the semiconductor memory device according to the present invention has a functional effect of realizing high-speed access without complication of a logic circuit and a functional effect of reducing a frequency of interconnections.

According to a ninth aspect of the present invention, the semiconductor memory device includes a read data control circuit connected to the main read signal line.

With this configuration, the semiconductor memory device according to the present invention has a functional effect of realizing high-speed access without a change in output data except when data read is performed, and a functional effect of reducing a frequency of interconnections.

According to a tenth aspect of the present invention, the integrated circuit includes a first switch inhibiting data transfer in data write.

With this configuration, the semiconductor memory device according to the present invention has a functional effect of realizing high-speed access without read of data to be written in data write, a functional effect of reducing a frequency of interconnections, and a functional effect of preventing an increase in power consumption.

According to an eleventh aspect of the present invention, the read/write circuit includes a second switch inhibiting data transfer in data write.

With this configuration, the semiconductor memory device according to the present invention has a functional effect of realizing high-speed access, a functional effect of reducing a frequency of interconnections, and a functional effect of preventing an increase in power consumption.

According to a twelfth aspect of the present invention, the integrated precharge control circuit of the hierarchical precharge control circuit is connected to a word line activation signal line.

With this configuration, the semiconductor memory device according to the present invention has a functional effect of realizing further high-speed access in such a manner that a hierarchical precharge control circuit and an integrated precharge control circuit operate in synchronization with a word line, a functional effect of reducing a frequency of interconnections, a functional effect of preventing an increase in power consumption, and a functional effect of preventing complication of internal control signals.

According to the present invention, as described above, it is possible to realize high-speed data read by division of a bit line, and to reduce a frequency of interconnections by unifying a main read signal line.

Accordingly, it is possible to realize high-speed access, to reduce a frequency of interconnections, to prevent an increase in power consumption, to prevent complication of internal control signals, and to suppress an increase in chip area.

BRIEF DESCRIPTION OF THE INVENTION

Figure 4:
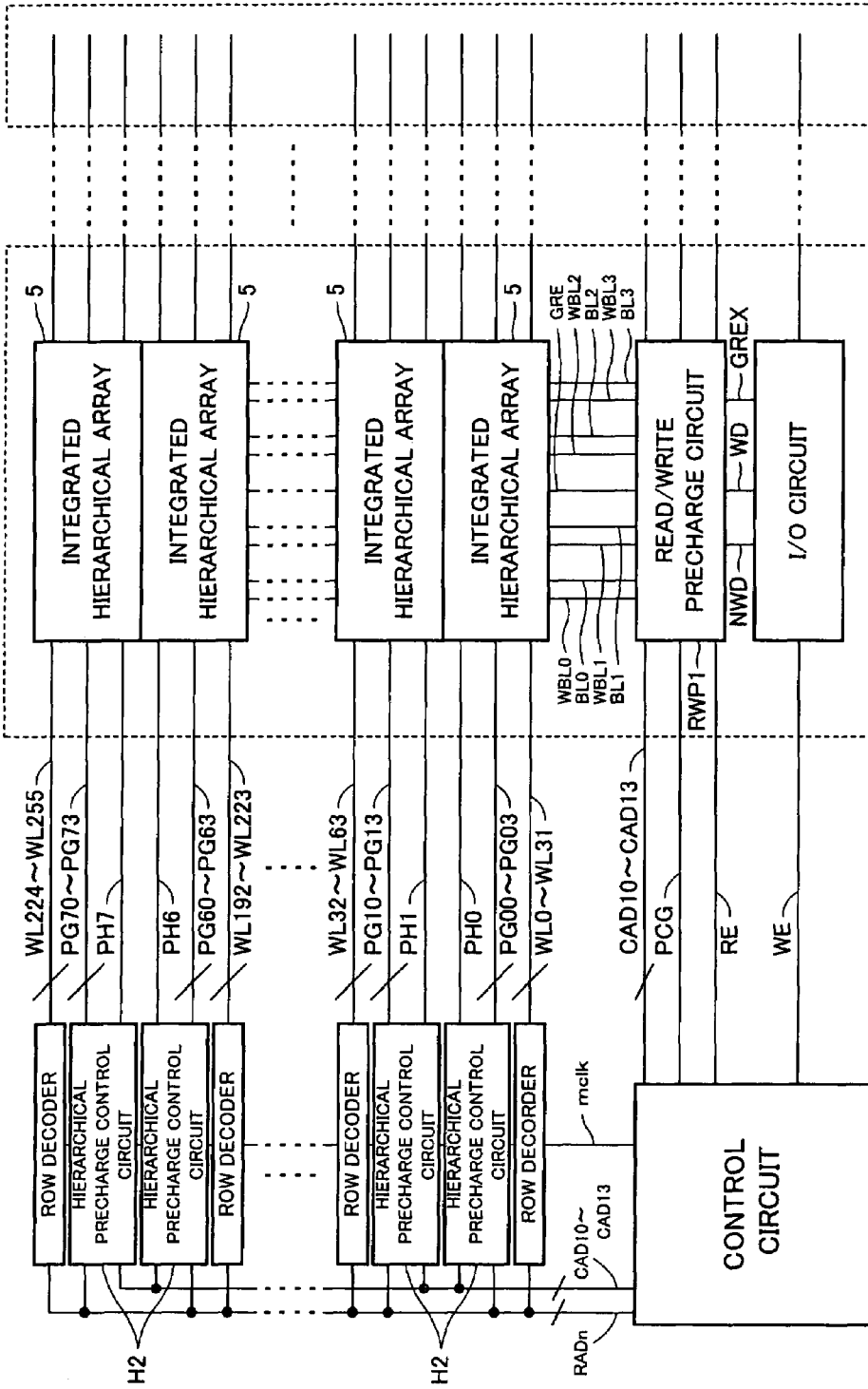
Figure 5:
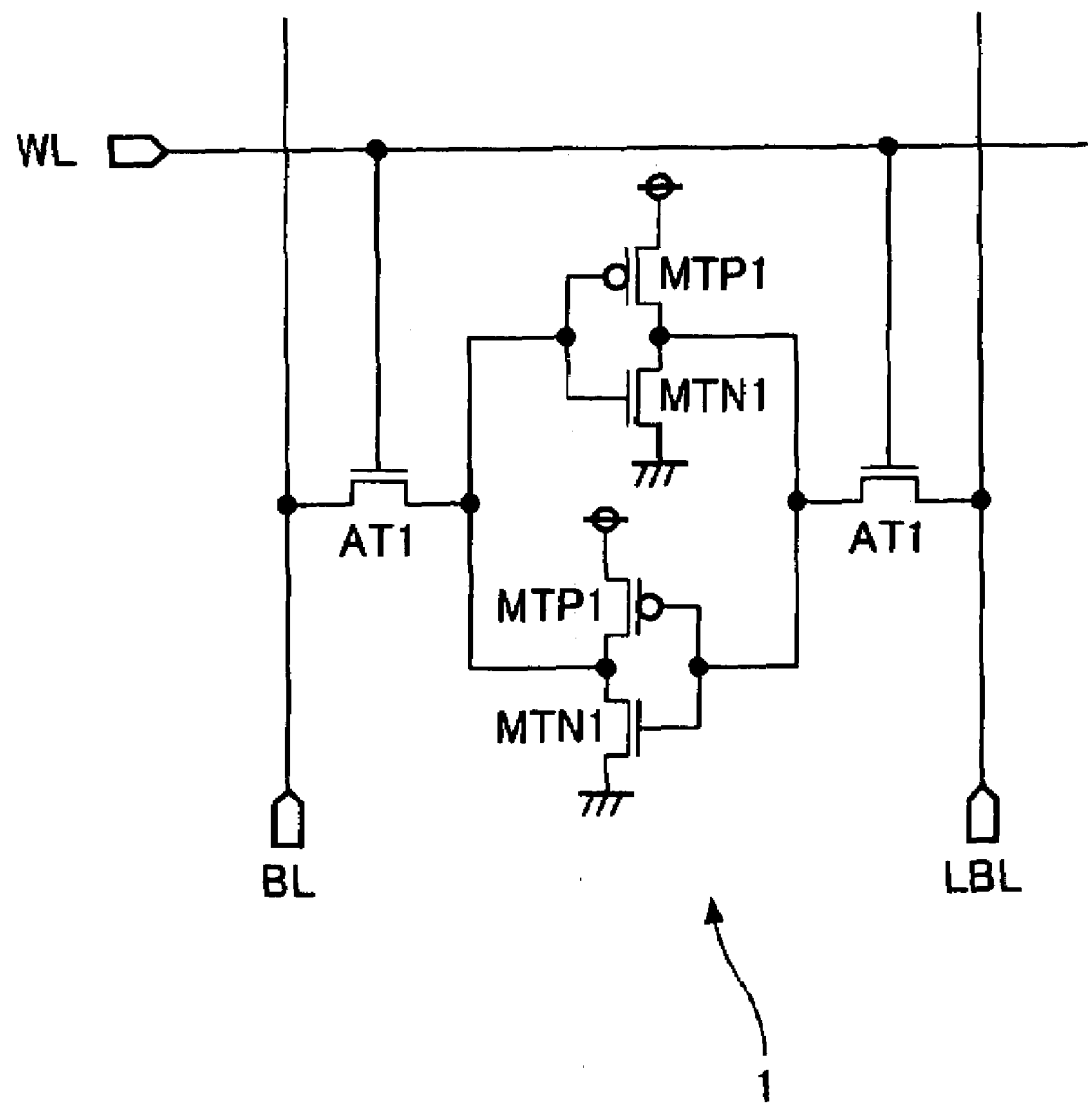
Figure 6:
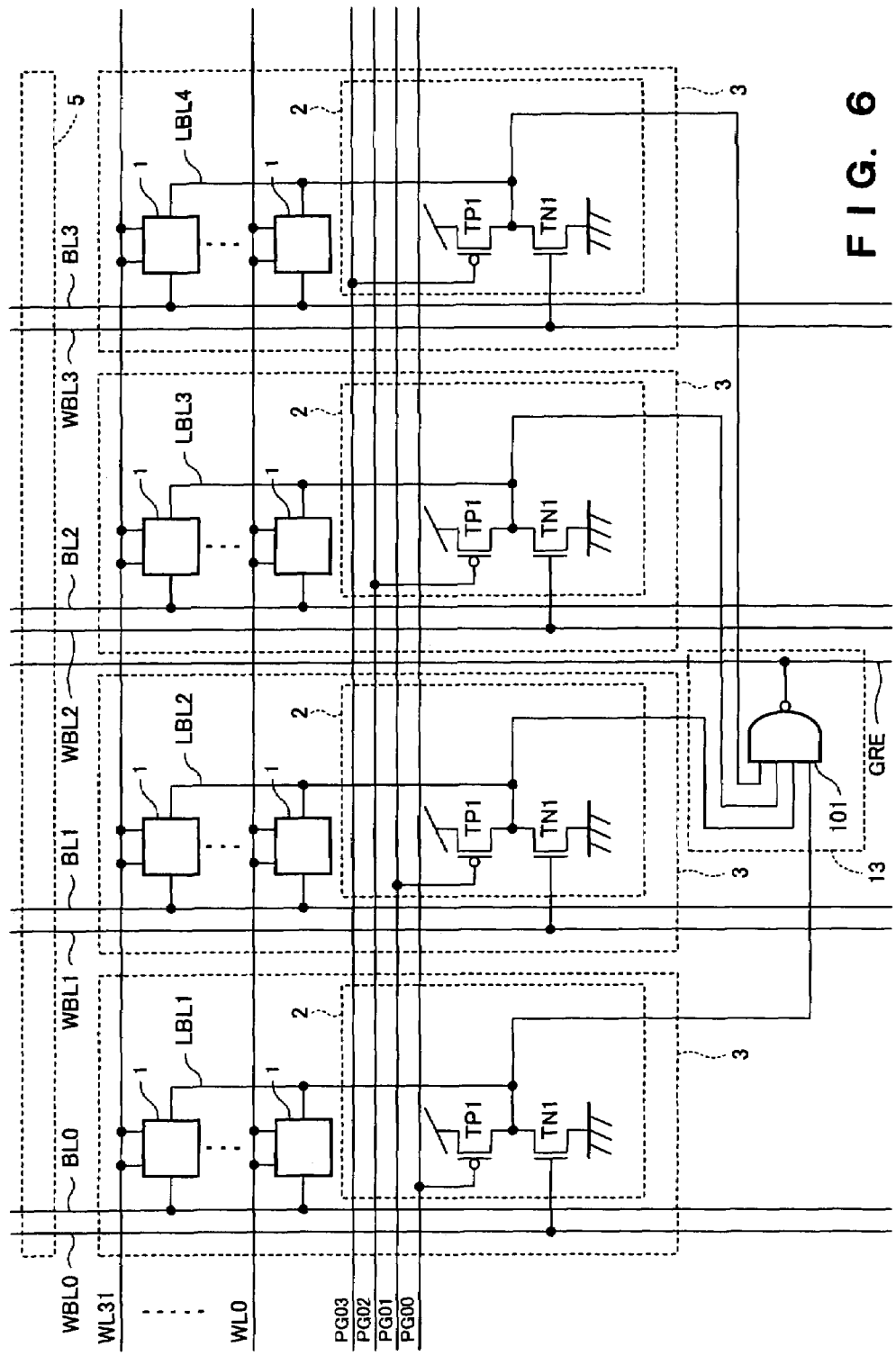

FIG. 4 schematically illustrates a memory macro in the semiconductor memory device according to the first embodiment;

FIG. 5 is a circuit diagram illustrating a configuration of a memory cell in the semiconductor memory device according to the first embodiment;

FIG. 6 is a circuit diagram illustrating a configuration of a second integrated hierarchical array in a semiconductor memory device according to a second embodiment of the present invention;

FIG. 7 is a circuit diagram illustrating a configuration of a second integrated circuit in a semiconductor memory device according to a third embodiment of the present invention; and FIG. 8 is a circuit diagram illustrating a configuration of a second read/write circuit in a semiconductor memory device according to a fourth embodiment of the present invention.

DESCRIPTION OF THE PREFERRED EMBODIMENTS

Hereinafter, specific description will be given of preferred embodiments of the present invention with reference to the drawings.

In the drawings for the description of the preferred embodiments, identical components are denoted by identical symbols; therefore, repetitive description thereof will not be given. Herein, description will be given of a configuration that data in four columns are read through one main read signal line. Such integration into the main read signal line is also applied to another column configuration. In addition, counts of word lines, bit lines, hierarchical arrays, integrated arrays, hierarchical precharge circuits and the like are not particularly limited to those described in the respective embodiments.

First Embodiment

First, description will be given of a semiconductor memory device according to a first embodiment of the present invention.

Figure 1:
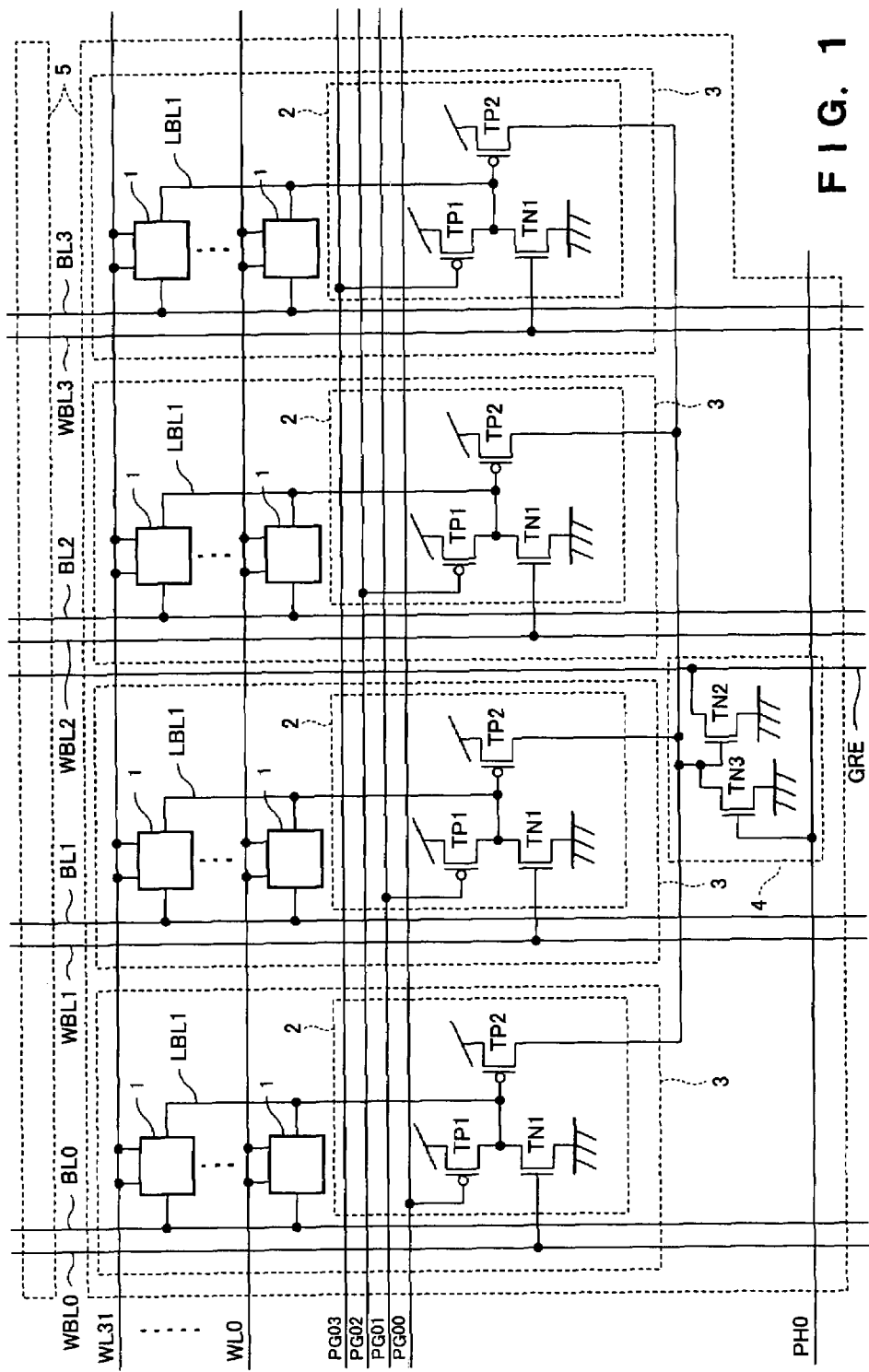
FIG. 1 is a circuit diagram illustrating a configuration of a first integrated hierarchical array in a semiconductor memory device according to a first embodiment of the present invention.

FIG. 1 is a circuit diagram illustrating a specific configuration of a first integrated hierarchical array in the semiconductor memory device according to the first embodiment. As illustrated in FIG. 1, the integrated hierarchical array 5 includes memory cells 1, read/write circuits 2, hierarchical arrays 3, an integrated circuit 4, first bit lines LBL1 connected to the memory cells 1, respectively, second bit lines BL0 to BL3 connected to the memory cells 1, respectively, write signal lines WBL0 to WBL3, a main read signal line GRE, word lines WL0 to WL31, hierarchical precharge control signal lines PG00 to PG03, an integrated precharge control signal line PH0 connected to the integrated circuit 4, N-channel transistors TN1, an N-channel transistor TN2, an integrated precharge transistor TN3, integrated precharge transistors TP1, and P-channel transistors TP2.

Figure 2:
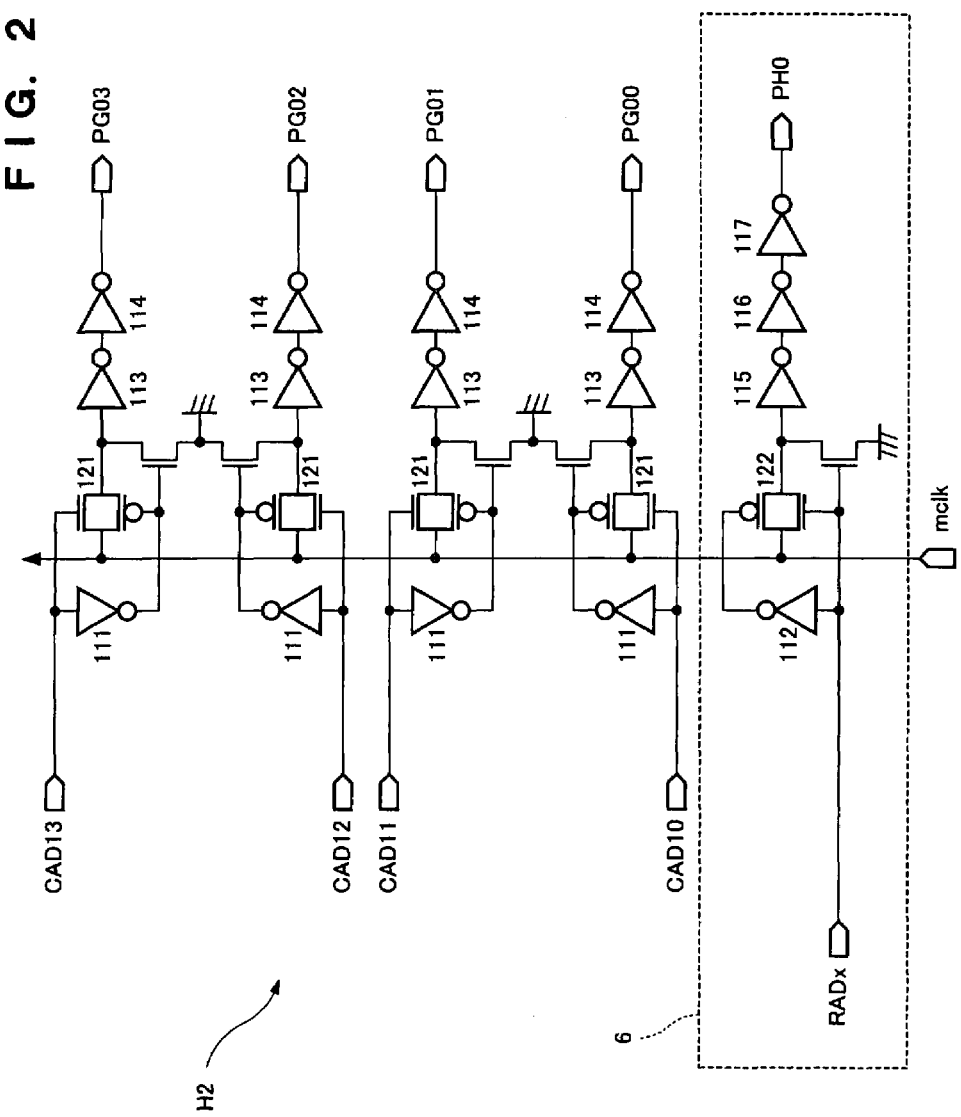
FIG. 2 is a circuit diagram illustrating a configuration of a hierarchical precharge control circuit in the semiconductor memory device according to the first embodiment.

FIG. 2 is a circuit diagram illustrating a specific configuration of a hierarchical precharge control circuit in the semiconductor memory device according to the first embodiment. As illustrated in FIG. 2, the hierarchical precharge control circuit H2 includes an integrated precharge control circuit 6, column decode signal lines CAD10 to CAD13, row predecode signal lines RAD0 to RAD7, a word line activation signal line mclk, inverters 111 to 117, and transfer gates 121 and 122.

Figure 3:
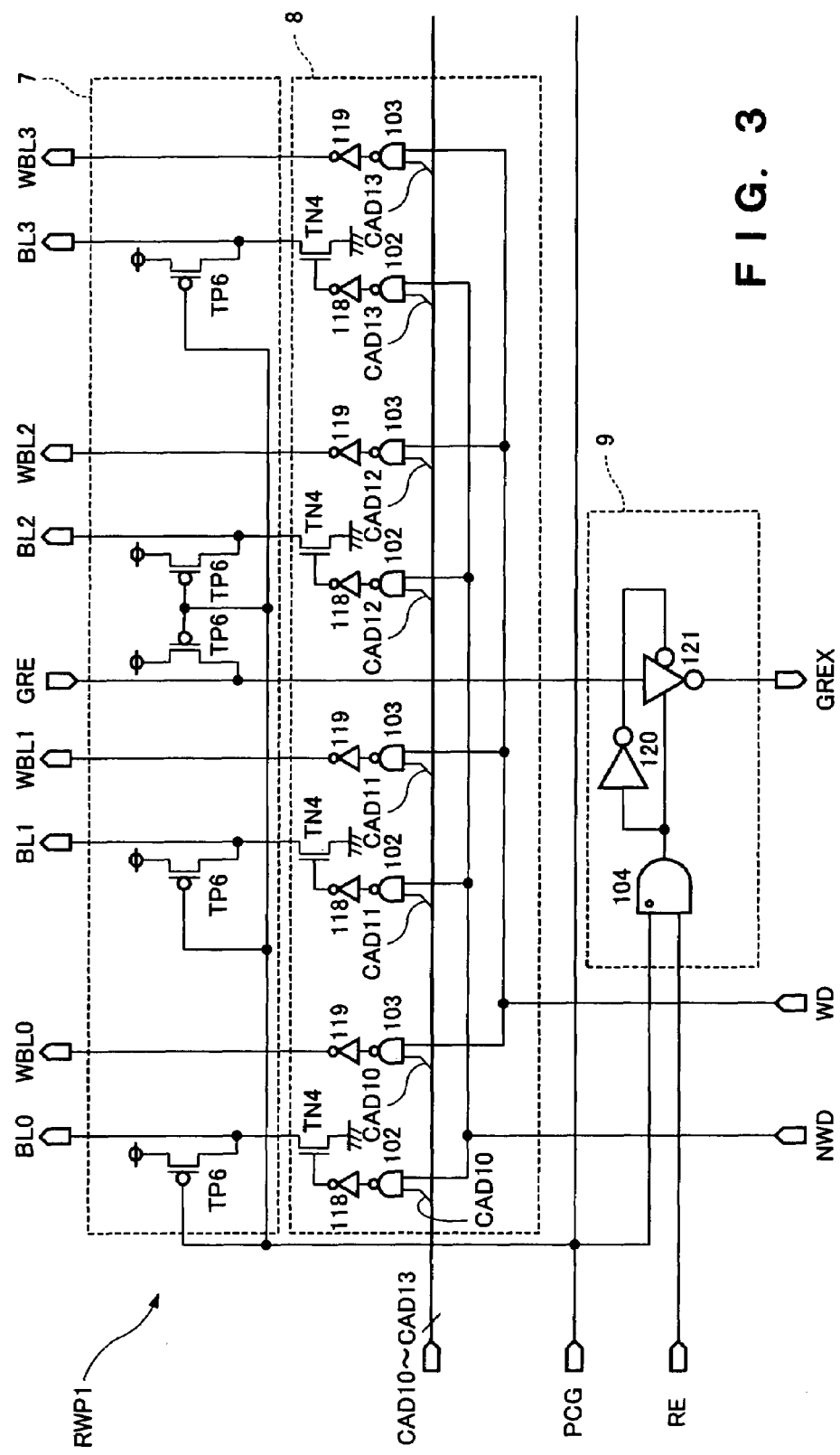
FIG. 3 is a circuit diagram illustrating a configuration of a read/write precharge circuit in the semiconductor memory device according to the first embodiment.

FIG. 3 is a circuit diagram illustrating a specific configuration of a read/write precharge circuit in the semiconductor memory device according to the first embodiment. As illustrated in FIG. 3, the read/write precharge circuit RWP1 includes a second precharge circuit 7, a data write circuit 8, a read data control circuit 9, a second precharge control signal line PCG, a read-operation activation signal line RE, a write data line WD, an inverse write data line NWD of the write data line WD, a read signal line GREX, NAND circuits 102 and 103, an AND circuit 104, inverters 118 to 121, N-channel transistors TN4, and second precharge transistors TP6.

FIG. 4 schematically illustrates a memory macro in the semiconductor memory device according to the first embodiment. As illustrated in FIG. 4, the, memory macro includes integrated hierarchical arrays 5, hierarchical precharge control circuits H2, a read/write precharge circuit RWP1, a write-operation activation signal line WE, word lines WL0 to WL255, hierarchical precharge control signal lines PG00 to PG73, and integrated precharge control signal lines PH0 to PH7.

FIG. 5 is a circuit diagram illustrating a configuration of a memory cell in the semiconductor memory device according to the first embodiment. As illustrated in FIG. 5, the memory cell 1 includes load transistors MTP1, drive transistors MTN1, and access transistors AT1.

As illustrated in FIG. 4, integrated hierarchical arrays (5) are arranged in a matrix form. The integrated hierarchical arrays (5) are connected to row decoders through corresponding word lines (WL0 to WL255), respectively. The integrated hierarchical arrays (5) are also connected to hierarchical precharge control circuits (H2) through corresponding hierarchical precharge control signal lines (PG00 to PG73) and corresponding integrated precharge control signal lines (PH0 to PH7), respectively. The row decoders are connected to a control circuit through a row predecode signal line (RADn) and a word line activation signal line (mclk). The hierarchical precharge control circuits (H2) are connected to the control circuit through column decode signal lines (CAD10 to CAD13), the row predecode signal line (RADn) and the word line activation signal line (mclk). The integrated hierarchical arrays (5) are connected to a read/write precharge circuit (RWP1) through second bit lines (BL0 to BL3) connected to a plurality of memory cells (1), write signal lines (WBL0 to WBL3), and a main read signal line (GRE). The read/write precharge circuit (RWP1) is connected to an I/O circuit through a write data line (WD), an inverse write data line (NWD) of the write data line (WD), and a read signal line (GREX). The read/write precharge circuit (RWP1) is connected to the control circuit through the column decode signal lines (CAD10 to CAD13), a second precharge control signal line (PCG) and a read-operation activation signal line (RE). The I/O circuit is connected to the control circuit through a write-operation activation signal line (WE).

As illustrated in FIG. 1, a plurality of memory cells (1) are connected to first bit lines (LBL1), respectively. The first bit lines (LBL1) are connected to read/write circuits (2). Thus, hierarchical arrays (3) are formed, respectively. The plurality of memory cells (1) in the hierarchical arrays (3) are connected to corresponding second bit lines (BL0 to BL3), respectively. The read/write circuits (2) in the hierarchical arrays (3) are connected to corresponding hierarchical precharge control signal lines (PG00 to PG03), corresponding write signal lines (WBL0 to WBL3), and an integrated circuit (4), respectively. The integrated circuit (4) is connected to a main read signal line (GRE).

As illustrated in FIG. 5, a memory cell (1) includes six transistors: two load transistors (MTP1), two drive transistors (MTN1) and two access transistors (AT1).

Herein, a hierarchical precharge transistor (TP1) illustrated in FIG. 1 is smaller in size than a second precharge transistor (TP6) illustrated in FIG. 3.

With regard to the semiconductor memory device according to the first embodiment, which is formed as described above, hereinafter, description will be given of operations thereof with reference to FIGS. 1 to 4.

In a standby state, first bit lines (LB1) and corresponding second bit lines (BL0 to BL3) in hierarchical arrays (3) are precharged at a predetermined potential, respectively. Data outputted from a read/write circuit (2) is discharged, and a main read signal line (GRE) is precharged at a predetermined potential. Each write signal line (WBL0 to WBL3) is set at "L" level.

Next, description will be given of a read/write operation in a case of selection of a memory cell (1) connected with a bit line (BL0) and a word line (WL0).

In data read, first, a control circuit (not illustrated) performs the following operations by reception of an external signal. That is, a column decode signal line (CAD10) is set at "H" level. Some of row predecode signal lines (RADn) are set at "H" level, respectively, in order to select the word line (WL0). A read-operation activation signal line (RE) is set at "H" level. A word line activation signal line (mclk) is set at "H" level. A second precharge control signal line (PCG) is set at "H" level.

When the word line (WL0) is set at "H" level, concurrently, a hierarchical precharge control signal line (PG00) is also set at "H" level. Thus, only the first bit line (LBL1) corresponding to the bit line (BL0) is released from the precharging. Herein, all the second bit lines (BL0 to BL3) are released from the precharging. In a plurality of integrated hierarchical arrays (5) including an integrated hierarchical array connected with the word line (WL0), moreover, each integrated precharge control circuit (6) illustrated in FIG. 2 outputs data set at "L" level. The data outputted from the read/write circuit (2) is released from the low precharging.

Herein, data in the memory cell (1) is transferred to the first bit line (LBL1). If the data in the memory cell (1) is set at "L" level, a current is flown from the bit line (LBL1) to the memory cell (1) so that the bit line (LBL1) is discharged. Then, data set at "H" level is outputted from the read/write circuit (2). Upon reception of the data, an integrated circuit (4) sets a main read signal line (GRE) at "L" level.

Herein, even when each of non-selected memory cells connected to a single word line has data set at "L" level, the precharging is not released. Therefore, the first bit lines (LBL1) connected to the non-selected memory cells are still precharged. Thus, it is possible to prevent data in a non-selected memory cell from being read.

On the other hand, if the data in the memory cell (1) is set at "H" level, the current is not flown from the first bit line (LBL1) into the memory cell (1). Therefore, data on the first bit line (LBL1) is still precharged, and the data outputted from the read/write circuit (2) is set at "L" level. As a result, the integrated circuit (4) does not set the main read signal line (GRE) at "L" level.

Upon reception of the data from the main read signal line (GRE), a read data control circuit (9) illustrated in FIG. 3 performs data transfer. The data is latched in an I/O circuit (not illustrated), and then is outputted externally.

In data write, first, the control circuit (not illustrated) performs the following operations by reception of an external signal. That is, the column decode signal line (CAD10) is set at "H" level. Some of the row predecode signal lines (RADn) are set at "H" level, respectively, in order to select the word line (WL0). A write-operation activation signal line (WE) is set at "H" level. The word line activation signal line (mclk) is set at "H" level. The second precharge control signal line (PCG) is set at "H" level.

Next, upon reception of a write-operation activation signal from the write-operation activation signal line (WE), an input data latch circuit in the I/O circuit (not illustrated) sets a write data line (WD) at "H" level and sets an inverse write data line (NWD) of the write data line (WD) at "L" level. Upon reception of the signals from these signal lines, the write signal line (WBL0) is set at "H" level while the bit line (BL0) is still set at "H" level.

When the word line (WL0) is set at "H" level, concurrently, the hierarchical precharge control signal line (PG00) is also set at "H" level. Thus, only the second bit line (BL0) selected from the second bit lines (BL0 to BL3) is released from the precharging, and only the corresponding first bit line (LBL1) is released from the precharging. The data outputted from the read/write circuit (2) is released from the low precharging.

Since the selected write signal line (WBL0) is set at "H" level, the read/write circuit, (2) outputs data set at "H" level. Thus, data set at "L" level is written to the memory cell (1) through the selected first bit line (LBL1). If the write data line (WD) is set at "L" level and the inverse write data line (NWD) of the write data line (WD) is set at "H" level, data set at "L" level is written to the memory cell (1) through the bit line (BL0) while the corresponding first bit line (LBL1) is still set at "H" level.

With the semiconductor memory device according to the first embodiment, as described above, it is possible to realize high-speed data read by division of a bit line. Further, it is possible to reduce a frequency of interconnections by use of a unified main read signal line, and to reduce an area by optimization in transistor size. Therefore, a practical effect of the semiconductor memory device is significant.

Second Embodiment

Next, description will be given of a semiconductor memory device according to a second embodiment of the present invention.

FIG. 6 is a circuit diagram illustrating a configuration of a second integrated hierarchical array in the semiconductor memory device according to the second embodiment. As illustrated in FIG. 6, the integrated hierarchical array 5 includes an integrated circuit 13 and a four-input NAND circuit 101. In the second embodiment, read data is inputted to the four-input NAND circuit 101. Therefore, it is unnecessary to provide an integrated precharge control circuit (6) (see FIG. 2). Remaining components in the integrated hierarchical array are equal to those in the integrated hierarchical array 5 described in the first embodiment.

Only a bit line (BL0) of a selected column address is released from precharging. If read data is set at "L" level, a four-input NAND circuit (101) outputs data set at "H" level. On the other hand, if the read data is set at "H" level, the four-input NAND circuit (101) outputs data set at "L" level.

With this configuration, it becomes unnecessary to control complicated integrated precharging. Further, it is possible to produce an effect of reduction in area. As in the first embodiment, moreover, it is possible to realize high-speed data read by division of a bit line. In addition, it is possible to reduce a frequency of interconnections by use of a unified main read signal line, and to reduce an area by optimization in transistor size. Therefore, a practical effect of the semiconductor memory device is significant.

Third Embodiment

Next, description will be given of a semiconductor memory device according to a third embodiment of the present invention.

FIG. 7 is a circuit diagram illustrating a configuration of a second integrated circuit in the semiconductor memory device according to the third embodiment. As illustrated in FIG. 7, the second integrated circuit 14 includes a P-channel transistor TP4. Remaining components in the integrated circuit 14 are equal to those in the integrated circuit 4 described in the first embodiment.

A P-channel transistor (TP4) receives a write-operation activation signal from a write-operation activation signal line (WE), thereby to stop data transfer. Even when a first bit line (LBL1) selected in data write is set at "L" level and a read transistor (TP1) of a read/write circuit (2) (see FIG. 1) outputs data set at "H" level, the P-channel transistor (TP4) inhibits transfer of the data set at "H" level. Therefore, it is possible to prevent a main read signal line (GRE) from being set at "L" level.

Thus, it is possible to reduce a frequency of precharging of a main read signal line in a precharge operation after a data write cycle. As in the first embodiment, moreover, it is possible to realize high-speed data read by division of a bit line. In addition, it is possible to reduce a frequency of interconnections by use of a unified main read signal line, and to reduce an area by optimization in transistor size. Therefore, a practical effect of the semiconductor memory device is significant.

Fourth Embodiment

Next, description will be given of a semiconductor memory device according to a fourth embodiment of the present invention.

FIG. 8 is a circuit diagram illustrating a configuration of a second read/write circuit in the semiconductor memory device according to the fourth embodiment. As illustrated in FIG. 8, the second read/write circuit 15 includes a P-channel transistor TP5. Remaining components in the read/write circuit 15 are equal to those in the read/write circuit 2 described in the first embodiment.

A P-channel transistor (TP5) receives a write-operation activation signal from a write-operation activation signal line (WE), thereby to stop data transfer. Even when a first bit line (LBL1) selected in data write is set at "L" level, the P-channel transistor (TP5) inhibits transfer of the data to a read transistor (TP1). Therefore, it is possible to prevent a main read signal line (GRE) from being set at "L" level.

Thus, it is possible to reduce a frequency of precharging of a main read signal line in a precharge operation after a data write cycle. As in the first embodiment, moreover, it is possible to realize high-speed data read by division of a bit line. In addition, it is possible to reduce a frequency of interconnections by use of a unified main read signal line, and to reduce an area by optimization in transistor size. Therefore, a practical effect of the semiconductor memory device is significant.

What is claimed is:

1. A semiconductor memory device comprising a plurality of integrated hierarchical arrays each having: a plurality of hierarchical arrays each including a plurality of memory cells connected to a first bit line and a second bit line and a read/write circuit connected to the first bit line, a write signal line and a hierarchical precharge control signal line; and an integrated circuit connected to the plurality of hierarchical arrays and a main read signal line, wherein the plurality of second bit lines, the plurality of write signal lines and the main read signal line are shared with the plurality of integrated hierarchical arrays.

2. The semiconductor memory device according to claim 1, wherein the read/write circuit includes: a hierarchical precharge control circuit having a hierarchical precharge transistor connected to the first bit line and the hierarchical precharge control signal line and controlling the hierarchical precharge transistor through the hierarchical precharge control signal line; and a second precharge circuit having a plurality of second precharge transistors connected to the plurality of second bit lines and the main read signal line, respectively.

3. The semiconductor memory device according to claim 2, wherein the hierarchical precharge transistor is smaller in size than the second precharge transistor.

4. The semiconductor memory device according to claim 2, wherein the hierarchical precharge control circuit is connected to a column decode signal line, and is provided in a row decoder.

5. The semiconductor memory device according to claim 1, wherein the integrated circuit is configured by using a logic circuit.

6. The semiconductor memory device according to claim 2, wherein the integrated circuit includes an integrated precharge transistor precharging data outputted from the hierarchical array, and the hierarchical precharge control circuit includes an integrated precharge control circuit controlling the integrated precharge transistor through an integrated precharge control signal line.

7. The semiconductor memory device according to claim 2, wherein the read/write circuit includes a P-channel transistor having a gate connected to the first bit line, an N-channel transistor having a gate connected to the write signal line, and a P-channel transistor having a gate connected to the hierarchical precharge control signal line from the hierarchical precharge control circuit.

8. The semiconductor memory device according to claim 6, wherein the integrated precharge control circuit stops the plurality of integrated precharge transistors concurrently.

9. The semiconductor memory device according to claim 2, further comprising a read data control circuit connected to the main read signal line.

10. The semiconductor memory device according to claim 2, wherein the integrated circuit includes a first switch inhibiting data transfer in data write.

11. The semiconductor memory device according to claim 2, wherein the read/write circuit includes a second switch inhibiting data transfer in data write.

12. The semiconductor memory device according to claim 2, wherein the integrated precharge control circuit of the hierarchical precharge control circuit is connected to a word line activation signal line.

* * * * *